United States Patent
Park et al.

(10) Patent No.: US 9,966,134 B1
(45) Date of Patent: May 8, 2018

(54) NON-VOLATILE RESISTIVE RANDOM-ACCESS MEMORY DEVICE WITH RELIABLE OPERATION INDICATOR, DEVICE-TO-DEVICE UNIFORMITY, AND MULTILEVEL CELL STORAGE, AND METHOD OF MANUFACTURING THE SAME

(71) Applicant: KOREA INSTITUTE OF SCIENCE AND TECHNOLOGY, Seoul (KR)

(72) Inventors: Jong Hyuk Park, Seoul (KR); Sang-Soo Lee, Seoul (KR); Keun-Young Shin, Seoul (KR); Young Jin Kim, Seoul (KR); Min Park, Seoul (KR); Heesuk Kim, Seoul (KR); Jeong Gon Son, Seoul (KR); Wan Ki Bae, Seoul (KR)

(73) Assignee: KOREA INSTITUTE OF SCIENCE AND TECHNOLOGY, Seoul (KR)

(*) Notice: Subject to any disclaimer, the term of this patent is extended or adjusted under 35 U.S.C. 154(b) by 0 days. days.

(21) Appl. No.: 15/407,357

(22) Filed: Jan. 17, 2017

(30) Foreign Application Priority Data

Nov. 4, 2016 (KR) .................... 10-2016-0146840

(51) Int. Cl.
*G11C 13/00* (2006.01)
*H01L 45/00* (2006.01)
*H01L 27/11* (2006.01)

(52) U.S. Cl.
CPC ...... *G11C 13/0002* (2013.01); *G11C 13/0007* (2013.01); *H01L 27/11* (2013.01); *H01L 45/1253* (2013.01); *H01L 45/1675* (2013.01)

(58) Field of Classification Search
CPC .............. H01L 27/11; H01L 45/1253; H01L 2924/1435; H01L 2924/1443;
(Continued)

(56) References Cited

U.S. PATENT DOCUMENTS

2016/0351256 A1* 12/2016 Xia .................... H01L 45/1273
2017/0155044 A1* 6/2017 Park ...................... H01L 45/16

FOREIGN PATENT DOCUMENTS

KR 1020130142761 B1 12/2014
WO WO 2014/110331 A1 7/2014

OTHER PUBLICATIONS

Huan et al., "High-Performance Programmable Metallization Cell Memory With the Pyramid-Structured Electrode," 2013, IEEE Electron Device Latters, vol. 34, No. 10, pp. 1244-1246.*

* cited by examiner

*Primary Examiner* — Jose R Diaz
(74) *Attorney, Agent, or Firm* — Goldilocks Zone IP Law

(57) ABSTRACT

Disclosed is a multilevel nonvolatile resistive random-access memory device including a lower electrode, an upper electrode, and an insulation film interposed between the lower electrode and the upper electrode. Each of the lower electrode and the upper electrode includes a plate-shaped portion, and a patterned portion formed on the plate-shaped portion, and the patterned portion includes a protruding 3-dimensional prism structure pattern in which a plurality of prism-shaped structures is repeatedly arranged at a constant interval in a given direction. The patterned portion of the lower electrode and the patterned portion of the upper electrode are arranged to face each other, and a longitudinal direction of the prism-shaped structures of the lower electrode patterned portion and a longitudinal direction of the prism-shaped structures of the upper electrode patterned portion cross each other.

10 Claims, 5 Drawing Sheets

(58) Field of Classification Search
 CPC .......... G11C 13/0002; G11C 13/0007; G11C 13/0009; G11C 13/0014
 See application file for complete search history.

NON-VOLATILE RESISTIVE RANDOM-ACCESS MEMORY DEVICE WITH RELIABLE OPERATION INDICATOR, DEVICE-TO-DEVICE UNIFORMITY, AND MULTILEVEL CELL STORAGE, AND METHOD OF MANUFACTURING THE SAME

CROSS-REFERENCE TO RELATED APPLICATIONS

This application claims, under 35 U.S.C. § 119, the priority of Korean Patent Application No. 10-2016-0146840 filed on Nov. 4, 2016 in the Korean Intellectual Property Office, the disclosure of which is incorporated herein by reference in its entirety.

BACKGROUND OF THE INVENTION

Field of the Invention

The present invention relates to a multilevel nonvolatile resistive random-access memory device and a method of manufacturing the same, and more particularly, to a multilevel nonvolatile resistive random-access memory device including a protruding 3-dimensional prism structure electrode in which a plurality of prism-shaped structures is repeatedly arranged at a constant interval in the same direction so as to achieve a reliable operation indicator, device-to-device uniformity, and multilevel cell storage, and a method of manufacturing the same.

Description of the Related Art

A nonvolatile memory device is a device that is capable of maintaining stored information even when power is shut off. Such a nonvolatile memory device has been used for information storage in computers, which need to continuously store information, as well as mobile appliances, such as digital cameras, cellular phones, and MP3 players. Recently, the capability to more rapidly and safely store a greater amount of information has been required due to advances in information communication technology. In the case of a NAND flash memory device, which is a currently commercialized nonvolatile memory device, a high threshold voltage (above 5V) is required when storing or removing charges in or from a charge storage layer, and the operation speed thereof is slow (above µs). In addition, the extent to which high-density integration of devices is possible by reducing a cell size has reached a limit. Therefore, research on next-generation nonvolatile memory devices that can replace the current technology is being conducted, and representative examples thereof may include a magnetic random-access memory (MRAM) device, a phase-change random-access memory (PRAM) device, and a resistive random-access memory (ReRAM) device.

Among these next-generation nonvolatile memory devices, a ReRAM device stores data using a material that has the property of being reversibly changed between a low resistance state and a high resistance state depending on the state of a voltage applied thereto. A high-capacity storage device needs to realize a low cost per bit. However, there is a technical limitation on a method of increasing a memory density while maintaining a minimum number of parts and reducing the cost of a system. As a method of overcoming this limitation, research on a multi-bit cell operation in which two or more pieces of data may be stored in a single memory cell is being conducted. Such research on the multi-bit cell operation in the ReRAM device is focused on the use of a resistance variation phenomenon depending on variation in compliance current and variation in applied voltage. However, a conventional ReRAM device cannot uniformly control conductive filaments, thus having deteriorated reproducibility, and causes malfunctions due to a slight difference in resistance value between resistance states and variation in resistance value with the lapse of time. In addition, problems caused by a difference between the operation indicators of devices need to be solved.

PRIOR ART DOCUMENT

Patent Document

Korean Patent Registration No. 1,384,286
International Patent Publication No. WO2014/110331

SUMMARY OF THE INVENTION

Therefore, the present invention has been made in view of the above problems, and it is an object of the present invention to provide a multilevel nonvolatile resistive random-access memory device, which is reliably driven at a low operation voltage, has high device-to-device uniformity, and enables high-density integration, and a method of manufacturing the same.

In accordance with an aspect of the present invention, to accomplish the above and other objects, there is provided a multilevel nonvolatile resistive random-access memory device including a lower electrode, an upper electrode, and an insulation film interposed between the lower electrode and the upper electrode, wherein each of the lower electrode and the upper electrode includes a plate-shaped portion, and a patterned portion formed on the plate-shaped portion, and the patterned portion includes a protruding 3-dimensional prism structure pattern in which a plurality of prism-shaped structures is repeatedly arranged at a constant interval in a given direction, and the patterned portion of the lower electrode and the patterned portion of the upper electrode are arranged to face each other, and a longitudinal direction of the prism-shaped structures of the lower electrode patterned portion and a longitudinal direction of the prism-shaped structures of the upper electrode patterned portion cross each other.

In the multilevel nonvolatile resistive random-access memory device according to the present invention, uniform conductive filaments, which are controlled by variation in compliance current or applied voltage, may be formed through spaces between the protruding prism-shaped structures. Thereby, the memory device may exhibit a high resistance of $10^4$ or more at a low operation voltage of 1 V or less, thus generating four or more resistance states.

The prism-shaped structures of the lower electrode and the prism-shaped structures of the upper electrode may cross each other at a crossing angle within a range from 60° to 120°.

The prism-shaped structures of the lower electrode and the prism-shaped structures of the upper electrode may have a height within a range from 10 nm to 10 µm and a width within a range from 10 nm to 10 µm, and a pitch between one prism-shaped structure and a next prism-shaped structure may be within a range from 10 nm to 10 µm.

Each of a tip of the prism-shaped structures of the lower electrode patterned portion and a tip of the prism-shaped structures of the upper electrode patterned portion may include a curved surface having a radius of curvature within a range from 5 nm to 100 nm.

Each of the lower electrode and the upper electrode may include a support body layer and a thin metal layer, and the thin metal layer may be formed on the patterned portion to a thickness within a range from 10 nm to 1000 nm.

The support body layer may be formed of a polymer resin or a metal. The polymer resin may be any one polymer resin or a blended polymer resin of two or more selected from among acryl resin, urethane resin, epoxy resin, polyester resin, phenol resin, polyvinyl chloride, amino resin, and polyacetal resin, and the metal may be any one or two or more metals selected from among silver (Ag), copper (Cu), nickel (Ni), chrome (Cr), platinum (Pt), gold (Au), lead (Pb), ruthenium (Ru), palladium (Pd), titanium (Ti), aluminum (Al), tungsten (W), cobalt (Co), tin (Sn), zinc (Zn), indium (In), iron (Fe), and manganese (Mn).

The thin metal layer of the lower electrode and the thin metal layer of the upper electrode may be the same as or different from each other, and may be formed independently of each other via deposition of any one or two or more metals selected from among silver, copper, nickel, chrome, platinum, gold, lead, ruthenium, palladium, titanium, aluminum, tungsten, cobalt, tin, zinc, indium, iron, and manganese.

The insulation film may be formed of any one or two or more metal oxides selected from among $NiO$, $SiO_2$, $TiO_2$, $ZnO$, $HfO_2$, $Nb_2O_5$, $MgO$, $Al_2O_3$, $Ta_2O_5$, $CuO$, $ZrO_2$, and $Fe_2O_3$.

The multi-level nonvolatile resistive random-access memory device may have a set operation voltage within a range from 0.1 V to 1.0 V and a reset operation voltage within a range from 0.1 V to 1.0 V, and may include four to sixteen resistance states having a resistance difference of ten times at a compliance current of $10^{-7}$ A to $10^{-5}$ A, thus storing 2 bits to 4 bits of information at a power consumption of $10^{-12}$ W to $10^{-6}$ W In accordance with another aspect of the present invention, there is provided a method of manufacturing a multi-level nonvolatile resistive random-access memory device, the method including forming a mask on a substrate, repeatedly forming a bar-shaped stripe pattern on the mask, performing a dry etching process on the substrate having the formed pattern, performing a wet etching process on the dry-etched substrate to manufacture a plurality of silicon templates on which reverse-prism structures are repeatedly formed, manufacturing a lower electrode, which includes a plate-shaped portion and a patterned portion including a protruding 3-dimensional prism structure pattern, in which a plurality of prism-shaped structures is repeatedly arranged at a constant interval in a given direction, by forming a thin metal layer on the surface of the reverse-prism structures of the manufactured silicon template via deposition of a first metal, and thereafter forming a support body layer on the silicon template having the formed thin metal layer, manufacturing an upper electrode, which includes a plate-shaped portion and a patterned portion including a protruding 3-dimensional prism structure pattern, in which a plurality of prism-shaped structures is repeatedly arranged at a constant interval in a given direction, by forming a thin metal layer on the surface of the reverse-prism structures of the manufactured silicon template via deposition of a second metal, and thereafter forming a support body layer on the silicon template having the formed thin metal layer, and arranging the upper electrode and the lower electrode such that the patterned portion of the lower electrode and the patterned portion of the upper electrode are arranged to face each other and such that a longitudinal direction of the prism-shaped structures of the lower electrode and a longitudinal direction of the prism-shaped structures of the upper electrode cross each other, and forming an insulation film between the lower electrode and the upper electrode.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
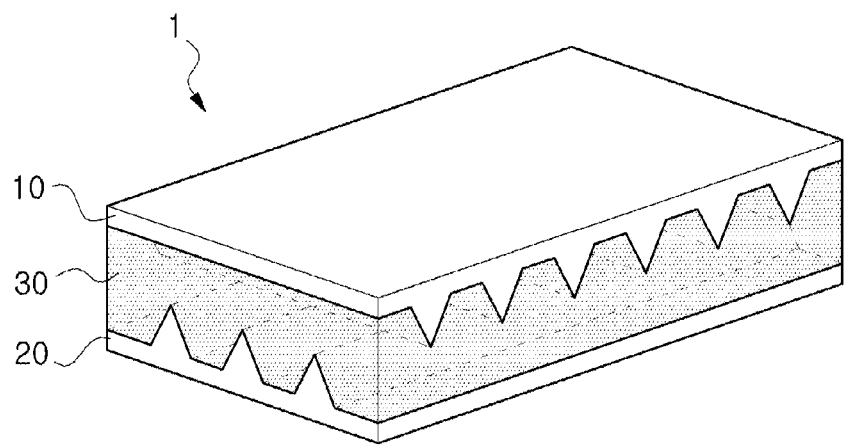
FIG. 1 is a perspective view illustrating a multi-level nonvolatile resistive random-access memory device manufactured according to an embodiment of the present invention.
Figure 2:
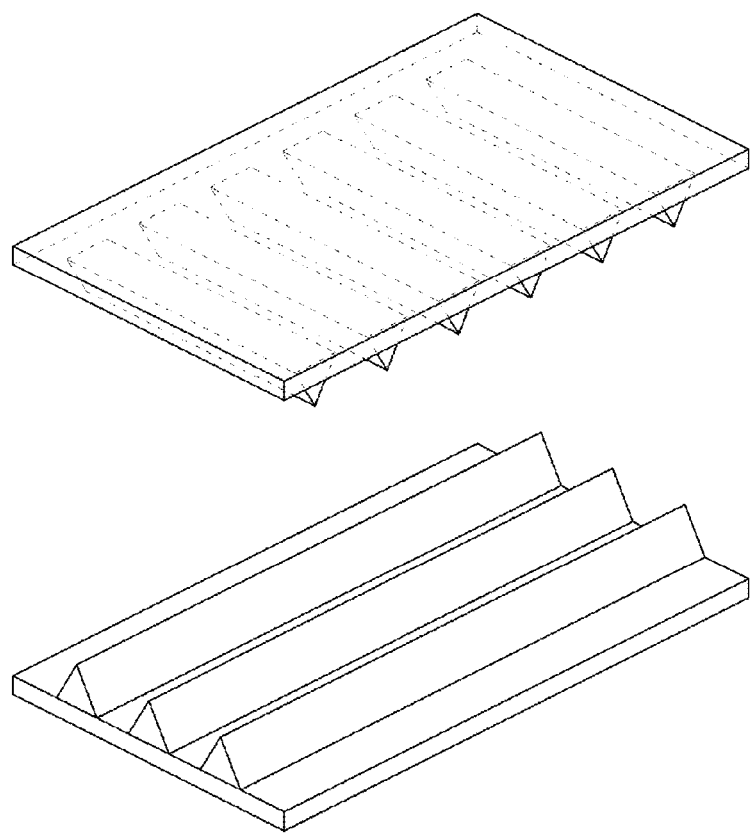
FIGS. 2 and 3 are perspective views diagrammatically illustrating the state in which an upper electrode and a lower electrode are arranged such that patterned portions thereof face each other and the longitudinal directions of prism-shaped structures formed on the patterned portions cross each other.
Figure 3:
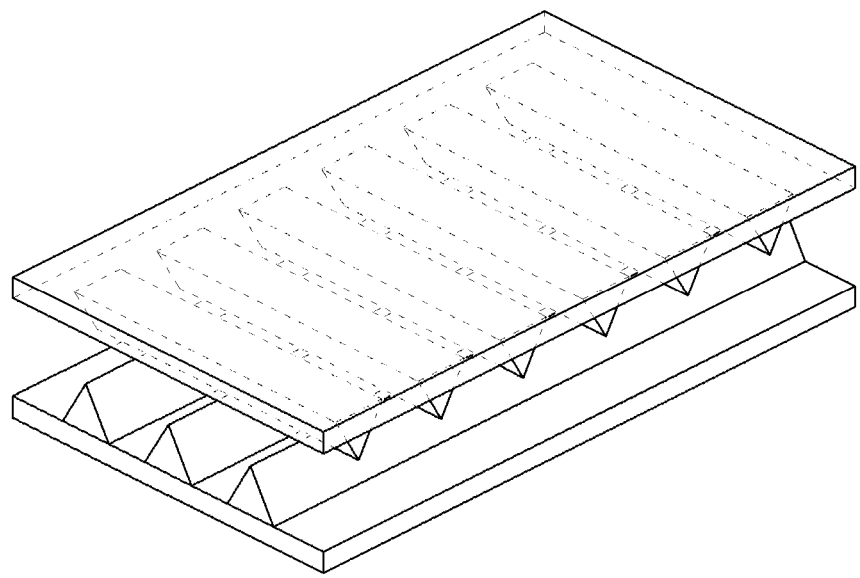
Figure 4:
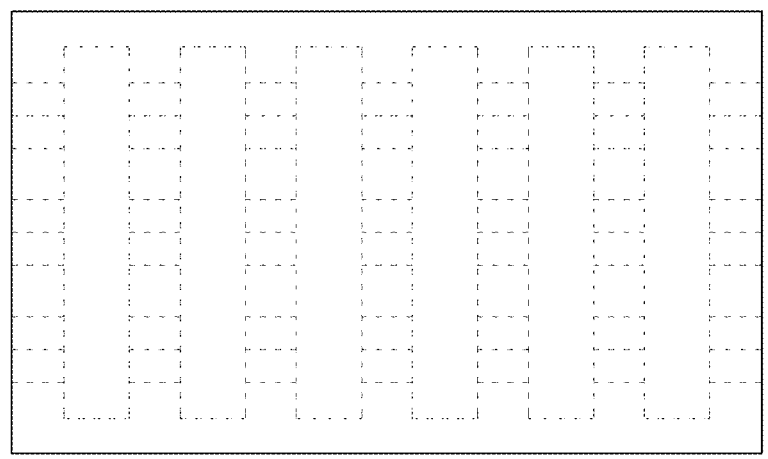
FIG. 4 is a perspective plan view illustrating the multi-level nonvolatile resistive random-access memory device manufactured according to the embodiment of the present invention.
Figure 5A:
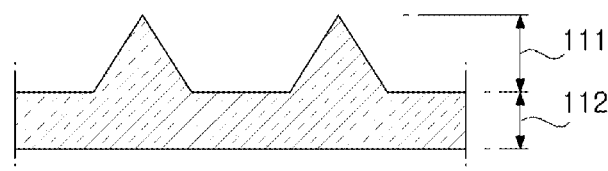
FIGS. 5A and 5B are side views of the upper electrode or the lower electrode according to the present invention.
Figure 5B:
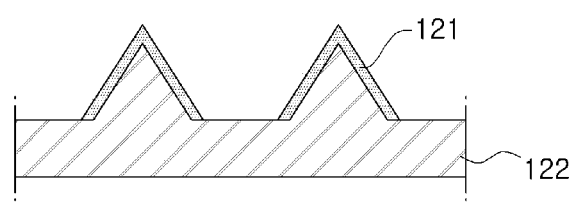

Hereinafter, the present invention will be described in more detail with reference to the accompanying drawings.

The present invention provides a nonvolatile resistive random-access memory (ReRAM) device, which is operable at a low voltage owing to the formation of uniform conductive filaments, and achieves a reliable operation indicator, device-to-device uniformity, and multi-level cell storage.

A single-level cell is a device that is capable of storing a single bit, i.e. only two resistance states of "0" and "1", per cell, and a multi-level cell is a device that is capable of storing several resistance states per cell, thus being capable of storing more than a single bit of information.

Specifically, the present invention provides a multi-level nonvolatile resistive random-access memory device, which may form at least four, and preferably four to sixteen, resistance states per cell using variation in compliance current.

Compliance current is a threshold current value that is set in order to prevent the destruction of a cell, and current is not increased above the compliance current, which is set during I-V sweep. The inventors of the present invention have realized a multi-level nonvolatile resistive random-access memory device as described below in which two electrodes, each including a plurality of prism-shaped structures, are arranged in a crossbar array form so as to form four or more resistance states per cell.

Referring to FIGS. 1 to 5, the multi-level nonvolatile resistive random-access memory device according to the present invention includes a lower electrode 20, an upper electrode 10, and an insulation film 30 interposed between the lower electrode 20 and the upper electrode 10. Each of the lower electrode 20 and the upper electrode 10 includes a plate-shaped portion 112, and a patterned portion 111 formed on the plate-shaped portion 112. The patterned portion 111 includes a so-called "protruding 3-dimensional prism structure pattern" in which a plurality of prism-shaped structures is repeatedly arranged at a constant interval in a given direction. The patterned portion of the lower electrode 20 and the patterned portion of the upper electrode 10 are arranged to face each other, and the longitudinal direction of the prism-shaped structures of the lower electrode 20 and the longitudinal direction of the prism-shaped structures of the upper electrode 10 cross each other.

According to the present invention, uniform conductive filaments may be formed through spaces between the multiple prism-shaped structures.

The 3-dimensional structure pattern has the feature by which the conductive filaments may be uniformly formed inside the insulation film despite a repeated resistance switching operation, thus allowing the memory device to be operable at a low voltage and improving the reliability of an operation indicator and device-to-device uniformity.

The prism-shaped structures of the lower electrode 20 and the prism-shaped structures of the upper electrode 10 may have a crossing angle ranging from 60° to 120°, and preferably may be orthogonal to each other at 90°. A crossing angle of 90° is preferable for the manufacture of high-density integration devices.

According to the present invention, each of the lower electrode 20 and the upper electrode 10 includes a support body layer 122 and a thin metal layer 121.

With the present invention, the plate-shaped portion 112 may be formed of only the support body layer 122, and the patterned portion 111 may be formed of only the thin metal layer 121, or may be formed of the thin metal layer 121 and the support body layer 122. In the case where the patterned portion 111 includes both the thin metal layer 121 and the support body layer 122, this means that the support body layer of the patterned portion 111 and the support body layer of the plate-shaped portion 112 are integrally formed with each other. With the present invention, the thin metal layer 121 may be formed on the top of the support body layer 122, and the thickness of the thin metal layer 121 may range from 10 nm to 1000 nm.

With the present invention, a constituent material of the support body layer 122 may be a polymer resin or a metal. The polymer resin may be any one or a blend of two or more selected from among acryl resin, urethane resin, epoxy resin, polyester resin, phenol resin, polyvinyl chloride, amino, and polyacetal, without being limited thereto. In addition, the metal may be any one or two or more metals selected from among silver (Ag), copper (Cu), nickel (Ni), chrome (Cr), platinum (Pt), gold (Au), lead (Pb), ruthenium (Ru), palladium (Pd), titanium (Ti), aluminum (Al), tungsten (W), cobalt (Co), tin (Sn), zinc (Zn), indium (In), iron (Fe), and manganese (Mn).

With the present invention, when the thickness of the thin metal layer 121, formed on the surface of the support body layer 122, is below 10 nm, the resistance of the electrode is increased, and thus the performance of the memory device is deteriorated, which makes it difficult to use the resulting electrode as the lower electrode 20 or the upper electrode 10. When the thickness of the thin metal layer 121 is above 1000 nm, it is not preferable to use the resulting electrode as the lower electrode 20 or the upper electrode 10 because the manufacturing costs are increased and the degree of integration of the device is reduced.

The metal that constitutes the thin metal layer formed on the lower electrode 20 may be a first metal, and the metal that constitutes the thin metal layer formed on the upper electrode 10 may be a second metal. The first metal and the second metal may be the same as or different from each other, and may be formed independently of each other via the deposition of any one or two or more metals selected from among silver, copper, nickel, chrome, platinum, gold, lead, ruthenium, palladium, titanium, aluminum, tungsten, cobalt, tin, zinc, indium, iron, and manganese.

With the present invention, the prism-shaped structures of the patterned portion 111 may have a height h ranging from 10 nm to 10 μm and a width w ranging from 10 nm to 10 μm, and the pitch p between one prism-shaped structure and the next prism-shaped structure may range from 10 nm to 10 μm.

When the height, width and pitch of the prism-shaped structures are below 10 nm, it is not easy to manufacture the structures. When the height, width and pitch of the prism-shaped structures are above 10 μm, the degree of integration of the device is low, causing deterioration in information storage performance.

According to the present invention, each of the tip of the prism-shaped structures of the lower electrode patterned portion and the tip of the prism-shaped structures of the upper electrode patterned portion may include a curved surface, of which the radius of curvature ranges from 5 nm to 100 nm. It was found that, when the tip is a curved surface having a radius of curvature ranging from 5 nm to 100 nm, the memory device has, in particular, uniform current distribution, is driven at a low set/reset operation voltage, and has excellent reproducibility, as compared to other structure shapes. On the other hand, it was found that, when the radius of curvature of the tip of the prism-shaped structures deviates from the aforementioned range, the performance of the memory device is deteriorated compared to the case where the tip includes the curved surface having the radius of curvature ranging from 5 nm to 100 nm.

Specifically, when the lower electrode and the upper electrode according to the present invention are applied to the memory device, the conductive filaments inside the memory device are formed around the tip of the 3-dimensional structures. The patterned portion of the lower electrode and the patterned portion of the upper electrode are arranged to face each other and are bonded to each other such that the longitudinal direction of the prism-shaped structures of the lower electrode patterned portion and the longitudinal direction of the prism-shaped structures of the upper electrode patterned portion cross each other (to form a crossbar array), whereby the amplification of an electric field may be maximized and the filaments may be formed at a relatively low voltage. Accordingly, because the operation voltage of the memory device is reduced and there are present four or more resistance states, which have a resistance difference of ten times at the maximum compliance current of $10^{-5}$ A, cell storage more than a single bit is possible at a maximum power consumption of $10^{-6}$ W without the addition of a memory cell, and excellent operational reliability and reproducibility may be achieved.

The formation and performance of this electric field may be changed depending on variables, such as, for example, the height, size, and radius of curvature of the prism-shaped structures, and the performance of the manufactured memory device may also be changed depending on these variables.

The insulation film 30 according to the present invention may be formed of any one or two or more metal oxides selected from among NiO, $SiO_2$, $TiO_2$, ZnO, $HfO_2$, $Nb_2O_5$, MgO, $Al_2O_3$, $Ta_2O_5$, CuO, $ZrO_2$, and $Fe_2O_3$, without being limited thereto.

The set operation voltage of the multi-level nonvolatile resistive random-access memory device may range from 0.1 V to 1.0 V, and the reset operation voltage thereof may range from 0.1 V to 1.0 V.

The multi-level nonvolatile resistive random-access memory device may store 2 bits to 4 bits of information at a power consumption of $10^{-6}$ W to $10^{-12}$ W because it may realize a low resistance state at a compliance current of $10^{-7}$ A or more, and may control four to sixteen resistance states so that the respective resistance states do not overlap each other.

Next, a method of manufacturing the multi-level nonvolatile resistive random-access memory device according to the present invention will be described.

The multi-level nonvolatile resistive random-access memory device according to the present invention may be manufactured by performing the following steps of:

(a) forming a mask on a substrate;

(b) repeatedly forming a bar-shaped stripe pattern on the mask;

(c) performing a dry etching process on the substrate having the formed pattern;

(d) performing a wet etching process on the dry-etched substrate to manufacture a plurality of silicon templates on which reverse-prism structures are repeatedly formed;

(e) manufacturing a lower electrode, which includes a plate-shaped portion and a patterned portion including a protruding 3-dimensional prism structure pattern, in which a plurality of prism-shaped structures is repeatedly arranged at a constant interval in a given direction, by forming a thin metal layer on the surface of the reverse-prism structures of the silicon template manufactured in the step (d) via deposition of a first metal, and thereafter forming a support body layer on the silicon template having the formed thin metal layer;

(f) manufacturing an upper electrode, which includes a plate-shaped portion and a patterned portion including a protruding 3-dimensional prism structure pattern, in which a plurality of prism-shaped structures is repeatedly arranged at a constant interval in a given direction, by forming a thin metal layer on the surface of the reverse-prism structures of the silicon template manufactured in the step (d) via deposition of a second metal, and thereafter forming a support body layer on the silicon template having the formed thin metal layer; and (g) arranging the lower electrode and the upper electrode such that the patterned portion of the lower electrode and the patterned portion of the upper electrode are arranged to face each other and such that the longitudinal direction of the prism-shaped structures of the lower electrode and the longitudinal direction of the prism-shaped structures of the upper electrode cross each other, and forming an insulation film between the lower electrode and the upper electrode.

With the present invention, the substrate may be a p-type or n-type silicon substrate, which is coated with silicon dioxide ($SiO_2$) or silicon nitride (SiN), and the thickness of the silicon oxide or silicon nitride coating layer may be 30 nm or more, and preferably, may range from 100 nm to 300 nm, in order to form the stripe pattern.

Subsequently, a mask is formed on the p-type or n-type silicon substrate coated with silicon dioxide ($SiO_2$) or silicon nitride (SiN) (hereinafter referred to as "substrate"). The method of forming the mask is not particularly limited, and the mask may be applied to the substrate via, for example, spin coating, screen printing, inkjet printing, or gravure coating.

Subsequently, a bar-shaped stripe pattern is repeatedly formed on the mask. The stripe pattern may be formed through a common lithography process, but is not limited thereto. For example, the stripe pattern may be formed through any one process selected from among a nanosphere lithography process, a focused ion beam (FIB) milling process, an optical lithography process, an electron-beam lithography process, and an interference lithography process.

In the stripe pattern, the pitch between one bar and the next bar may be 10 nm or more, and preferably, may range from 10 nm to 10 μm. When the pitch is below the aforementioned range, the formation of a uniform pattern may be difficult. When the pitch is above the aforementioned range, the degree of integration of the manufactured multi-level nonvolatile resistive random-access memory device may be deteriorated.

Subsequently, the substrate having the formed stripe pattern is subjected to a dry etching process. A dry etching apparatus may be selected from among a reactive ion etching (RIE) apparatus and an inductively coupled plasma etching apparatus.

The depth of a dry-etched area of the substrate may be sufficient to remove the silicon dioxide ($SiO_2$) or silicon nitride (SiN) layer coated on the substrate.

With the present invention, when silicon dioxide or silicon nitride inside a mask-patterned area is not completely removed after the dry etching process, the subsequent wet etching of the silicon substrate may not be performed properly.

With the present invention, the substrate, etched by the dry etching process, may be washed using a wash solution so that the mask is washed. The wash solution may be, for example, acetone.

Subsequently, the wet etching process may be performed using an aqueous potassium hydroxide solution having a molar concentration ranging from 4.5 to 6.5 at a temperature of 60° C. to 70° C. for a time of 1 minute to 10 minutes. When the molar concentration of the aqueous potassium hydroxide solution is below 4.5, a silicon etching process is difficult to perform. When the molar concentration of the aqueous potassium hydroxide solution is above 6.5, defects may occur on the silicon surface. In addition, when the reaction temperature of the wet etching process is below 60° C., a silicon etching process is difficult to perform. When the reaction temperature of the wet etching process is above 70° C., defects may occur on the silicon surface. In addition, when the time of the wet etching process is below 1 minute, a silicon etching process is difficult to perform properly. When the time of the wet etching process is above 10 minutes, over-etching occurs, causing undesirable defects on the silicon surface.

With the present invention, when the silicon dioxide or silicon nitride coating layer of the silicon substrate, etched through the wet etching process, is removed using hydrogen fluoride (HF), the formation of metal electrodes, the thin metal layers 121 of which are connected to each other, is possible. When the coating layer is not removed, the formation of independent metal electrodes, in which the thin metal layers 121 of the prism-shaped structures are not connected, is possible.

A silicon template is completed by the processes described above.

The surface of the silicon template may be washed using a piranha solution, and a chemical oxide film may be formed thereon, prior to using the silicon template.

The silicon template is used to manufacture the upper electrode and the lower electrode.

The method of manufacturing the lower electrode using the silicon template will not be described. First, a first metal is deposited on the silicon template. The deposited first metal forms the thin metal layer 121 of the lower electrode. With the present invention, the first metal may be any one or two or more selected from among silver, copper, nickel, chrome, platinum, gold, lead, ruthenium, palladium, titanium, aluminum, tungsten, cobalt, tin, zinc, indium, iron, and manganese. The deposition may be one of sputtering, atomic layer deposition (ALD), thermal evaporation, pulsed laser deposition (PLD), electron-beam evaporation, physical vapor deposition (PVD), and chemical vapor deposition (CVD), without being limited thereto. According to the present invention, the metal may be deposited to a thickness ranging from 10 nm to 1000 nm. When the thickness of the deposited metal deviates from the aforementioned range, the performance of the manufactured device may be deteriorated.

Subsequently, the support body layer 122 is formed on the thin metal layer 121. The constituent material of the support body layer 122 may be a polymer resin or a metal. When the support body layer 122 is formed of a polymer resin, the support body layer 122 may be formed through a template stripping process that includes a polymer curing process. The polymer resin may be any one polymer resin or a blended polymer resin of two or more selected from among acryl resin, urethane resin, epoxy resin, polyester resin, phenol resin, polyvinyl chloride, amino resin, and polyacetal resin.

Meanwhile, when the support body layer 122 is formed of a metal, the support body layer 122 may be formed through an electroplating process, and the metal may be any one or two or more metals selected from among silver (Ag), copper (Cu), nickel (Ni), chrome (Cr), platinum (Pt), gold (Au), lead (Pb), ruthenium (Ru), palladium (Pd), titanium (Ti), aluminum (Al), tungsten (W), cobalt (Co), tin (Sn), zinc (Zn), indium (In), iron (Fe), and manganese (Mn). With the present invention, the thickness of the metal layer deposited through the electroplating process may be at least 1 μm or more, and preferably may range from 10 μm to 100 μm. When the thickness of the metal layer is below 10 μm, stripping may not be easy. When the thickness of the metal layer is above 100 μm, the manufacturing costs may be increased.

The lower electrode manufactured via the above-described process includes the support body layer 122 and the thin metal layer 121, which is formed on the support body layer 122 and takes the form of a prism structure in which prism-shaped structures are repeatedly arranged at a constant interval. The features of the prism structure have been described above. The prism-shaped structure has a feature by which the tip thereof includes a curved surface, of which the radius of curvature ranges from 5 nm to 100 nm.

Subsequently, the upper electrode 10 may be manufactured via the same method as the method of manufacturing the lower electrode 20. The thin metal layer of the upper electrode 10 may be manufactured by depositing a second metal, and the second metal may be the same as or different from the first metal. The second metal may be any one or two or more selected from among silver, copper, nickel, chrome, platinum, gold, lead, ruthenium, palladium, titanium, aluminum, tungsten, cobalt, tin, zinc, indium, iron, and manganese.

Subsequently, the lower electrode and the upper electrode are arranged in a cross-bar array form such that the patterned portion of the lower electrode and the patterned portion of the upper electrode face each other, and such that the longitudinal direction of the prism-shaped structures of the lower electrode patterned portion and the longitudinal direction of the prism-shaped structures of the upper electrode patterned portion cross each other, and an insulation film is formed between the lower electrode and the upper electrode.

The insulation film may be formed of any one or two or more metal oxides selected from among NiO, $SiO_2$, $TiO_2$, ZnO, $HfO_2$, $Nb_2O_5$, MgO, $Al_2O_3$, $Ta_2O_5$, CuO, $ZrO_2$, and $Fe_2O_3$, without being limited thereto. The insulation film may be formed using any one of sputtering, atomic layer deposition, thermal evaporation, pulsed laser deposition, electron-beam evaporation, physical vapor deposition, and chemical vapor deposition, without being limited thereto. The thickness of the insulation film may range from 5 nm to 28.5 μm.

Hereinafter, the present invention will be described in more detail using preferred examples. However, these examples are provided to more concretely describe the present invention, and it will be apparent to those skilled in the art that the scope of the present invention is not limited by these examples.

Manufacturing Example 1

A p-type silicon substrate, over which silicon nitride is coated to a thickness of 100 nm, was positioned inside a glass tub in which isopropyl alcohol (IPA) is accommodated, and was washed through an ultrasonication process. Then, the washed substrate was washed using isopropyl alcohol and nitrogen blowing. The washed substrate was positioned inside a glass tub in which methanol is accommodated, and was again washed through an ultrasonication process, and then washed using methanol and nitrogen blowing. The washed substrate was positioned inside a glass tub in which acetone is accommodated, and was further washed through an ultrasonication process, and then completely washed using acetone and nitrogen blowing.

The washed substrate was subjected to a pre-annealing process at 120° C. for 60 seconds using a hot plate. The pre-annealed substrate was coated with an embossed photoresist (GXR 601) using spin coating equipment. In coating, specifically, after a photoresist solution was applied to the substrate, the substrate was subjected to spin coating at 500 rpm for 5 seconds and 4000 rpm for 30 seconds so that a photoresist having a thickness of about 1 μm was formed on the substrate. The substrate having the formed photoresist was subjected to a soft bake process at 100° C. for 90 seconds using a hot plate.

The substrate, subjected to the soft bake process, was subjected to an exposure process using mask aligner equipment. The exposure process was performed using a chrome photomask having a stripe pattern and a mercury lamp that emits monochromatic light having a wavelength of 365 nm and an output voltage of 20 mW. The exposure process was of a low vacuum contact type and was performed for 3 seconds. The substrate having the exposed photoresist was subjected to a developing process for 20 seconds using an AZ 300 MIF developing solution. The substrate having the developed photoresist was washed using distilled water and nitrogen gas, and was subjected to a hard bake process at 120° C. for 60 seconds using a hot plate.

As a result of analyzing the photoresist substrate, which was subjected to the exposure and developing processes, using a scanning electron microscope, it was found that a stripped photoresist pattern, in which the width of bars and the pitch between the bars are about 2 μm, was formed.

Subsequently, the substrate having the photoresist pattern formed thereon was subjected to a dry etching process using a reactive ion etching apparatus. The reactive ion etching process was performed using $CF_4$ at 40 sccm and $O_2$ at 5 sccm at a pressure of 10 mTorr and power of 100 W for 15 minutes. The substrate having the photoresist pattern, etched through the reactive ion etching process, was processed using acetone so that the photoresist pattern was removed.

As a result of analyzing the substrate, etched through the reactive ion etching process, using the scanning electron microscope after the photoresist pattern was removed, it was found that the etched depth was 200 nm.

Manufacturing Example 2

A stripped photoresist pattern, in which the width of bars and the pitch between the bars are about 4.5 μm, was manufactured using the same method as that of Manufacturing Example 1. Subsequently, a dry etching process was performed using a reactive ion etching apparatus, and the photoresist pattern was removed, in the same manner as that of Manufacturing Example 1.

Manufacturing Example 3

The etched substrate, manufactured in Manufacturing Example 1, was subjected to a wet etching process using an aqueous potassium hydroxide solution. The wet etching process was performed in the aqueous potassium hydroxide solution having a molar concentration of 5 at a temperature of 60° C. for 10 minutes. The silicon substrate, etched by the wet etching process, was washed using distilled water and nitrogen blowing, and was processed using hydrogen fluoride for 10 minutes so that the silicon nitride layer coated over the substrate surface is removed, and thereafter was washed using distilled water, acetone and nitrogen blowing. As a result of analyzing the silicon template, from which the silicon nitride layer has been removed, using a scanning electron microscope, it was found that reverse-prism-shaped structures, the width of etched indentations and the pitch between the indentations of which are about 2 μm, were formed.

Manufacturing Example 4

The etched substrate, manufactured in Manufacturing Example 2, was subjected to the same wet etching and hydrogen fluoride processing as those of Manufacturing Example 3. As a result of analyzing the silicon template, from which the silicon nitride layer has been removed, using a scanning electron microscope, it was found that reverse-pyramid-shaped structures, the width of bars and the pitch between the bars of which are 4 μm to 5 μm, were formed.

Example 1

The silicon template of Manufacturing Example 4 was subjected to surface washing using piranha solution in which sulfuric acid and hydrogen peroxide are mixed at a ratio of 1:1, and a chemical oxide film was formed thereon.

Subsequently, Cu was deposited through an evaporation process. The deposition through the evaporation process was performed at a pressure of $10^7$ torr and a rate of 1 to 2 Å/sec. The thickness of the deposited Cu was analyzed using quartz crystal microbalance (QCM). It was found that the Cu was deposited to a thickness of about 180 nm.

Subsequently, an adhesive in which epoxy resin and a curing agent are mixed in a ratio of 1:1 was applied to the Cu deposited surface of the silicon template, and a thermosetting process was performed at 120° C. for 2 hours. By performing a template stripping process using a razor blade on the Cu deposited silicon template that has been subjected to the thermosetting process, an electrode including a polymer resin support body layer and a thin metal layer having a 3-dimensional prism structure pattern was manufactured. As a result of analyzing using a scanning electron microscope, the pitch between the one prism-shaped structure and the next prism-shaped structure was measured to be 4 to 5 μm, and the radius of curvature of the tip of the prism-shaped structure was measured to be about 20 nm.

The same two electrodes were manufactured and used as an upper electrode and a lower electrode respectively.

Example 2

An electrode was manufactured via the same method as in Example 1, but the thin metal layer was formed by depositing Ni, rather than Cu. The radius of curvature of the tip of the prism-shaped structure was measured to be about 10 nm.

Example 3

An electrode was manufactured via the same method as in Example 1, but the thin metal layer was formed by depositing Ag, rather than Cu. The radius of curvature of the tip of the prism-shaped structure was measured to be about 30 nm.

Example 4

An electrode was manufactured via the same method as in Example 1, but a metallic support body layer was formed using an electroplating apparatus. Electroplating was performed at room temperature using $H_2SO_4$ (1 M) and $CuSO_4$ (0.25 M) as an electrolyte solution, and by connecting a copper (Cu) foil (having a thickness of 25 μm) to a positive (+) pole, and connecting the Cu deposited silicon template to a negative (−) pole. Thereby, it was found that a thick copper layer was formed on the thin Cu layer.

Test Example 1

A memory device was manufactured by arranging the two electrodes manufactured in Example 1 as an upper electrode and a lower electrode and forming an $Al_2O_3$ insulation film between the upper electrode and the lower electrode. The performance of the manufactured device was measured using an Agilent 4155C semiconductor characterization system. A copper tape and silver paste were connected to the surface of the lower electrode and a copper wire was connected to the upper electrode.

The formation of conductive filaments was attempted by applying a voltage to twenty memory cells according to the present invention. In the resistive memory device based on the conductive filaments, the voltage and compliance current required for the formation of the filaments are generally associated with the thickness of the filaments. In the resistive memory device based on the conductive filaments, as illustrated in FIG. 6, it was found that the filaments were formed at a voltage within a range from 0.3 V to 0.5 V under the same compliance current, and were switched to a low resistance state.

Figure 6:
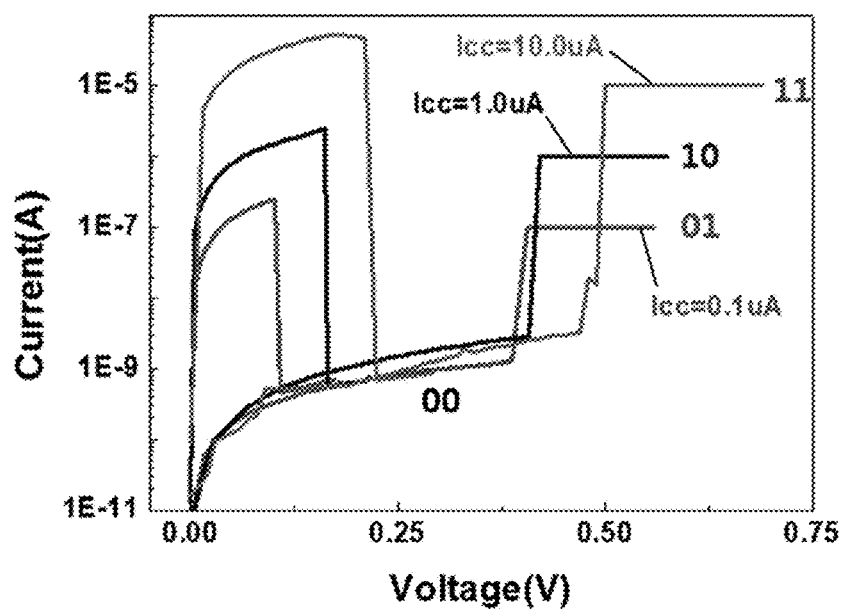
FIG. 6 is a graph illustrating the result of checking the formation of four resistance states via variation in the compliance current of the multi-level nonvolatile resistive random-access memory device according to the present invention.

As illustrated in FIG. 6, the device according to the present invention formed a total of four resistance states of 00, 01, 10 and 11 under the provision of compliance current differences of 0.1 μA, 1 μA, and 10 μA, and could store 2 bits of information per cell. In addition, because a resistance difference between the respective resistance states was ten times, the storage density could be increased and errors could be minimized.

Test Example 2

Whether multi-level driving was performed was found based on variation in applied pulse voltage. A voltage was applied in a pulse manner as described below so that the resistance states were adjusted depending on the strength of the applied voltage.

Figure 7:
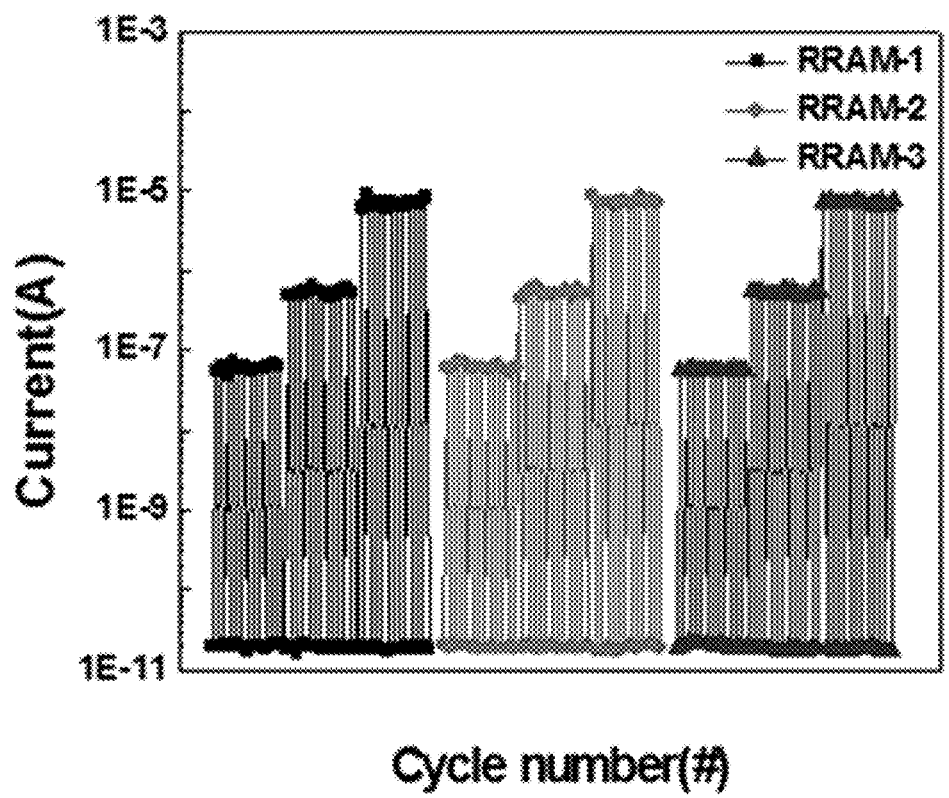
FIG. 7 is a graph illustrating the result of checking the reliability and reproducibility of multi-level driving depending on variation in the applied pulse voltage of the multi-level nonvolatile resistive random-access memory device according to the present invention.

[Applied Voltage]
$V_{read(00)} = 0.05$ V
$V_{set(01)} = 0.38$ V
$V_{reset(01)} = -0.11$ V
$V_{set(10)} = 00.42$ V
$V_{reset(10)} = -0.17$ V
$V_{set(11)} = 00.49$ V
$V_{reset(11)} = -0.21$ V As illustrated in FIG. 7, it was found that the resistance states were formed with almost no error range at the same applied voltage. In addition, it was found that the resistance states were changed as the strength of the applied voltage was changed, and the respective resistance states showed a difference of 10 times or more. The reliability of the memory device according to the present invention was proven via repeated cycles, and the safety of operation was proven as a result of performing an operation while changing the resistance states in the order of 01→10→11.

In addition, it found be found that the memory device according to the present invention has operational reliability and reproducibility, as a result of performing the same measurement on three different cells, which were manufactured independently of each other.

Power consumption upon multi-level driving was measured based on variation in applied pulse voltage, and is illustrated in the following Table 1 (Power=voltage X current).

TABLE 1

| State | Average (Set Power, W) | STD (Set Power) | Average (Reset Power, W) | STD (Reset Power) |
|---|---|---|---|---|
| 01 | 1.94E-08 | 1.14E-08 | 3.11E-12 | 9.66E-13 |
| 10 | 2.43E-07 | 4.98E-08 | 5.29E-12 | 9.08E-13 |
| 11 | 4.88E-06 | 9.40E-07 | 1.09E-11 | 3.06E-12 |

As represented in Table 1, it was found that the memory device according to the present invention was multi-level driven at a maximum of 4.88E-06 W (watt) or less. Because the error range was very low as shown from STD calculation results, the reliability of the memory device according to the present invention was proven.

Test Example 3

Multi-level data retention of the memory device according to the present invention was found. A read voltage is a voltage that is applied to read only currently stored data without having an effect on the behavior of a cell (i.e. the behavior for change from one state to another state). Whether or not the preserved data may be maintained for a long time was checked while applying only a read voltage in the formed four resistance states.

Figure 8:
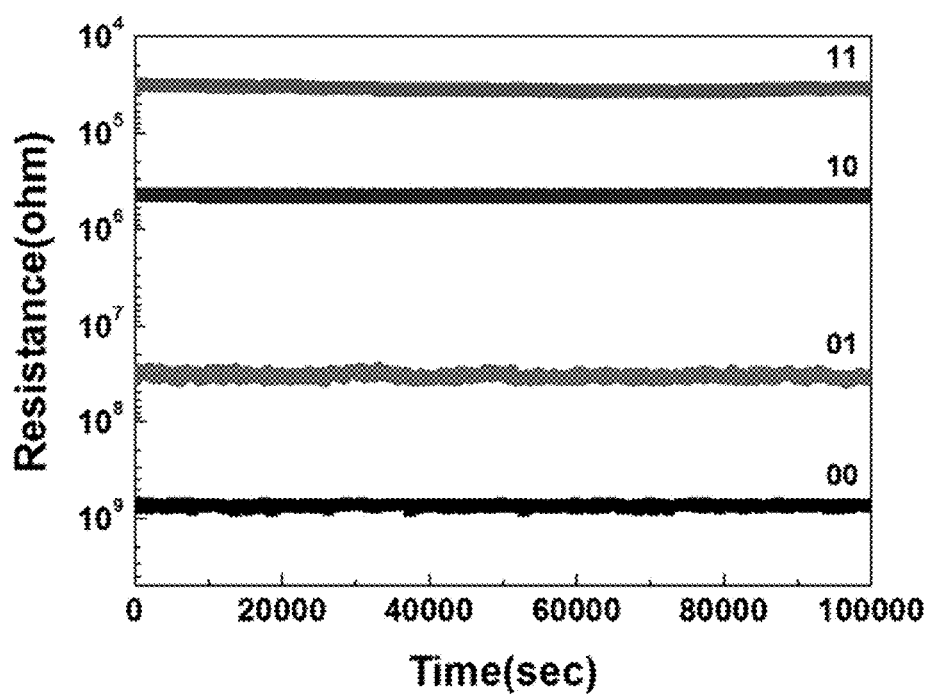
FIG. 8 is a graph illustrating the result of checking the multi-level data retention of the multi-level nonvolatile resistive random-access memory device according to the present invention.

As illustrated in FIG. 8, it was found that the memory device according to the present invention is maintained without data loss or errors even when a read voltage of 0.05 V is applied for $10^5$ seconds or more.

Through the results described above, it was found that the memory device according to the present invention is stable in terms of reliability, reproducibility, and data retention.

As is apparent from the above description, in a multi-level nonvolatile resistive random-access memory device according to the present invention, through a structure in which a protruding 3-dimensional prism structure pattern of a lower electrode and a protruding 3-dimensional prism structure pattern of an upper electrode are bonded to each other in a crossbar array form, uniform conductive filaments, which are controlled by an electric field inside an insulation film, are formed. As such, the memory device may be driven at a low operating voltage within a range from 0.1 V to 1.0 V, may store 2 or more bits of data without the addition of a memory cell at a maximum power consumption of $10^{-6}$ W with four or more resistance states having a resistance difference of 10 times within the maximum compliance current of $10^{-5}$ A, and may achieve excellent operational reliability and reproducibility. This includes cycle-to-cycle operation reliability and reproducibility as well as device-to-device operation reliability and reproducibility. In addition, because rapid resistance switching of 100 ns or less is possible owing to an increase in the mobility of inner ions by an electric field, the memory device according to the present invention may be applied to a next-generation memory device.

What is claimed is:

1. A method of manufacturing a multi-level nonvolatile resistive random-access memory device, the method comprising:
   forming a mask on a substrate;
   repeatedly forming a bar-shaped stripe pattern on the mask;
   performing a dry etching process on the substrate having the formed pattern;
   performing a wet etching process on the dry-etched substrate to manufacture a plurality of silicon templates on which reverse-prism structures are repeatedly formed;
   manufacturing a lower electrode, which includes a plate-shaped portion and a patterned portion including a protruding 3-dimensional prism structure pattern, in which a plurality of prism-shaped structures is repeatedly arranged at a constant interval in a given direction, by forming a thin metal layer on the surface of the reverse-prism structures of the manufactured silicon template via deposition of a first metal, and thereafter forming a support body layer on the silicon template having the formed thin metal layer;

manufacturing an upper electrode, which includes a plate-shaped portion and a patterned portion including a protruding 3-dimensional prism structure pattern, in which a plurality of prism-shaped structures is repeatedly arranged at a constant interval in a given direction, by forming a thin metal layer on the surface of the reverse-prism structures of the manufactured silicon template via deposition of a second metal, and thereafter forming a support body layer on the silicon template having the formed thin metal layer; and arranging the upper electrode and the lower electrode such that the patterned portion of the lower electrode and the patterned portion of the upper electrode are arranged to face each other and such that a longitudinal direction of the prism-shaped structures of the lower electrode and a longitudinal direction of the prism-shaped structures of the upper electrode cross each other, and forming an insulation film between the lower electrode and the upper electrode.

2. The method according to claim 1, wherein the dry etching process is selected from among a reactive ion etching process and an inductively coupled plasma etching process.

3. The method according to claim 1, wherein the first metal and the second metal are the same as or different from each other, are respectively any one or two or more metals selected from among silver, copper, nickel, chrome, platinum, gold, lead, ruthenium, palladium, titanium, aluminum, tungsten, cobalt, tin, zinc, indium, iron, and manganese, and are deposited independently of each other to a thickness of 10 nm to 1000 nm.

4. The method according to claim 1, wherein the support body layer, formed in the manufacturing the upper electrode, is formed of any one polymer resin or a blended polymer resin of two or more selected from among acryl resin, urethane resin, epoxy resin, polyester resin, phenol resin, polyvinyl chloride, amino resin, and polyacetal resin.

5. The method according to claim 1, wherein the support body layer, formed in the manufacturing the upper electrode, is formed of any one or two or more metals selected from among silver (Ag), copper (Cu), nickel (Ni), chrome (Cr), platinum (Pt), gold (Au), lead (Pb), ruthenium (Ru), palladium (Pd), titanium (Ti), aluminum (Al), tungsten (W), cobalt (Co), tin (Sn), zinc (Zn), indium (In), iron (Fe), and manganese (Mn).

6. The method according to claim 1, wherein the prism-shaped structures have a height within a range from 10 nm to 10 μm and a width within a range from 10 nm to 10 μm, and a pitch between one prism-shaped structure and a next prism-shaped structure is within a range from 10 nm to 10 μm.

7. The method according to claim 1, wherein each of a tip of the prism-shaped structures of the lower electrode patterned portion and a tip of the prism-shaped structures of the upper electrode patterned portion includes a curved surface having a radius of curvature within a range from 5 nm to 100 nm.

8. The method according to claim 1, wherein the insulation film is formed of any one or two or more metal oxides selected from among $NiO$, $SiO_2$, $TiO_2$, $ZnO$, $HfO_2$, $Nb_2O_5$, $MgO$, $Al_2O_3$, $Ta_2O_5$, $CuO$, $ZrO_2$, and $Fe_2O_3$.

9. The method according to claim 1, wherein, in the arranging, the prism-shaped structures of the lower electrode and the prism-shaped structures of the upper electrode cross each other at a crossing angle within a range from 60° to 120°.

10. The method according to claim 1, wherein the multi-level nonvolatile resistive random-access memory device has a set operation voltage within a range from 0.1 V to 1.0 V and a reset operation voltage within a range from 0.1 V to 1.0 V, and includes four to sixteen resistance states having a resistance difference of ten times at a compliance current of $10^{-7}$ A to $10^{-5}$ A, thus storing 2 bits to 4 bits of information at a power consumption of $10^{-12}$ W to $10^{-6}$ W.

* * * * *